(12) United States Patent
Dupont

(10) Patent No.: US 7,531,428 B2
(45) Date of Patent: May 12, 2009

(54) RECYCLING THE RECONDITIONED SUBSTRATES FOR FABRICATING COMPOUND MATERIAL WAFERS

(75) Inventor: Frederic Dupont, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 363 days.

(21) Appl. No.: 11/084,553

(22) Filed: Mar. 18, 2005

(65) Prior Publication Data

US 2006/0099776 A1    May 11, 2006

(30) Foreign Application Priority Data

Nov. 9, 2004    (EP) .................................. 04292655

(51) Int. Cl.
*H01L 21/46* (2006.01)
(52) U.S. Cl. .................. 438/458; 438/406; 438/455; 438/459; 257/E21.568; 257/E21.122
(58) Field of Classification Search ................. 438/455, 438/458, 459
See application file for complete search history.

(56) References Cited

U.S. PATENT DOCUMENTS

| | | | |
|---|---|---|---|
| 4,471,689 A | 9/1984 | Piana | ........................... 99/295 |
| 4,886,674 A | 12/1989 | Seward et al. | .................. 426/79 |
| 5,854,123 A | 12/1998 | Sato et al. | |
| 6,127,199 A | 10/2000 | Inoue et al. | |
| 6,223,650 B1 | 5/2001 | Stuck | |
| 6,225,650 B1 | 5/2001 | Tadatomo et al. | ............. 257/190 |
| 6,246,068 B1 | 6/2001 | Sato et al. | |
| 6,251,754 B1 | 6/2001 | Ohshima et al. | |
| 6,258,698 B1 | 7/2001 | Iwasaki et al. | ............... 438/455 |
| 6,284,629 B1 * | 9/2001 | Yokokawa et al. | .......... 438/459 |
| 6,328,796 B1 | 12/2001 | Kub et al. | |
| 6,372,608 B1 | 4/2002 | Shimoda et al. | |
| 6,391,799 B1 | 5/2002 | Di Cioccio | |
| 6,468,923 B1 | 10/2002 | Yonehara et al. | |
| 6,475,882 B1 | 11/2002 | Sakai et al. | |
| 6,497,763 B2 | 12/2002 | Kub et al. | |
| 6,596,610 B1 | 7/2003 | Kuwabara et al. | ............ 438/458 |
| 6,613,678 B1 * | 9/2003 | Sakaguchi et al. | .......... 438/695 |
| 6,624,047 B1 | 9/2003 | Sakaguchi et al. | |
| RE38,466 E | 3/2004 | Inoue et al. | |

(Continued)

FOREIGN PATENT DOCUMENTS

EP    0767 486 A2    4/1997

(Continued)

*Primary Examiner*—Thanh V Pham
(74) *Attorney, Agent, or Firm*—Winston & Strawn LLP

(57) ABSTRACT

Methods for fabricating compound material wafers are described. An embodiment of the method includes providing a donor substrate having a surface, forming a weakened zone in the donor substrate to define a transfer layer that includes the donor substrate surface, bonding the surface of the transfer layer to a handle substrate, and detaching the donor substrate at the weakened zone to transfer the transfer layer onto the handle substrate. Consequently, a compound material wafer is formed, and the transfer layer detached donor wafer provides a remainder substrate having a surface where the transfer layer was detached. Next, an additional layer is deposited onto a surface of the remainder substrate to increase its thickness and to form a reconditioned substrate, and the reconditioned substrate is recycled as a donor substrate for fabricating additional compound material wafers.

19 Claims, 2 Drawing Sheets

U.S. PATENT DOCUMENTS

| | | |
|---|---|---|
| 6,716,722 B1 * | 4/2004 | Furihata et al. ............. 438/459 |
| 6,740,345 B2 | 5/2004 | Cai ........................... 426/77 |
| 6,794,276 B2 | 9/2004 | Letertre et al. |
| 6,867,067 B2 | 3/2005 | Ghyselen et al. |
| 7,186,628 B2 | 3/2007 | Nakano ....................... 438/455 |
| 2001/0019153 A1 | 9/2001 | Sato et al. |
| 2002/0146893 A1 | 10/2002 | Shimoda et al. |
| 2003/0010280 A1 | 1/2003 | Sugihara et al. ............... 117/97 |
| 2003/0087503 A1 | 5/2003 | Sakaguchi et al. |
| 2003/0119217 A1 | 6/2003 | Plossl et al. |
| 2003/0153163 A1 | 8/2003 | Letertre et al. |
| 2003/0224582 A1 | 12/2003 | Shimoda et al. |
| 2004/0056254 A1 | 3/2004 | Bader et al. |
| 2004/0152284 A1 | 8/2004 | Ghyselen et al. |
| 2004/0185638 A1 | 9/2004 | Kakizaki et al. |
| 2004/0219762 A1 | 11/2004 | Shimoda et al. |

FOREIGN PATENT DOCUMENTS

| | | |
|---|---|---|
| EP | 1 026 728 A2 | 8/2000 |
| EP | 1 039 513 A2 | 9/2000 |
| EP | 1 471 578 A1 | 10/2004 |
| JP | 5-275332 A | 10/1993 |
| WO | WO 2004/019404 | 3/2004 |

* cited by examiner

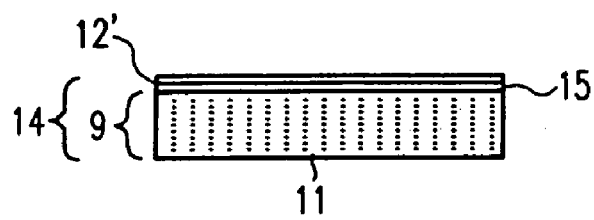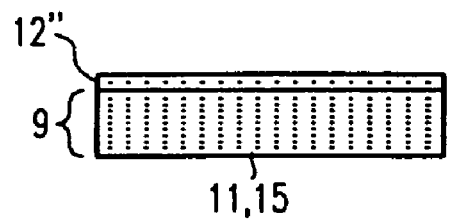
Fig.2a   Fig.2b
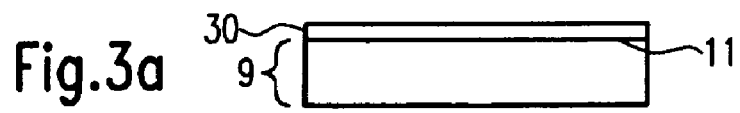
Fig.3a
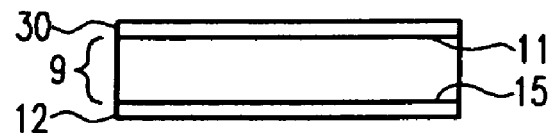
Fig.3b
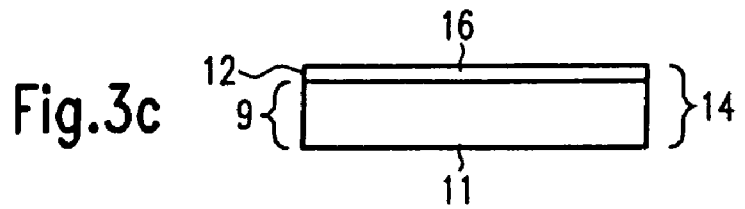
Fig.3c

RECYCLING THE RECONDITIONED SUBSTRATES FOR FABRICATING COMPOUND MATERIAL WAFERS

BACKGROUND ART

The present invention generally relates to methods for fabricating compound material wafers. An embodiment includes providing a donor substrate, forming a weakened zone in the donor substrate to define a transfer layer, bonding the surface of the transfer layer to a handle substrate, and detaching the donor substrate at the weakened zone to transfer the transfer layer onto the handle substrate. This forms a compound material wafer, and the transfer layer detached donor wafer provides a remainder substrate having a surface where the transfer layer was detached. Next, an additional layer is deposited onto a surface of the remainder substrate to increase its thickness and to form a reconditioned substrate, and the reconditioned substrate is recycled as a donor substrate for fabricating additional compound material wafers.

Published U.S. application no. 2003/0153163 describes a method for transferring a layer of material from a donor substrate to a handle substrate using the SMART-CUT® technology. The method includes forming a donor substrate by bonding a first wafer having a transfer layer to a support substrate. U.S. application no. 2003/0153163 discloses that it is advantageous to form such a donor wafer for transferring layers of expensive material because it allows for repeated use of the transfer operation from the same initial first wafer, until that wafer is too thin to proceed again.

There are several drawbacks to this known method. Due to the fact that the donor substrate is composed of two wafers bonded together, the donor wafer thickness, in particular for the first few transfers, is typically much larger than the thickness of donor wafers used in standard processes. For example, such a donor substrate is thicker than that typically used in the SMART-CUT® technology process for producing silicon on insulator wafers. Accordingly, the equipment used for handling and supporting the donor wafers during the transfer process has to be specially adapted to the increased weight and thickness, or else the support substrate has to be specially reduced in thickness. Both of these solutions, however, require adaptive steps which are very costly. In addition, during the manufacturing process, the thickness of the donor wafer varies, and the extent of the variation depends on the number of transfers performed. As a consequence, the processing and handling equipment needs to be specially designed to cope with the varying conditions. Such specially designed equipment adds more expense to the process.

SUMMARY OF THE INVENTION

Presented are methods for fabricating compound material wafers which overcome the problems of the prior art, and which enable compound material wafers to be fabricated using standard wafer processing equipment. An embodiment includes providing a donor substrate having a surface, forming a weakened zone in the donor substrate to define a transfer layer that includes the donor substrate surface, bonding the surface of the transfer layer to a handle substrate, and detaching the donor substrate at the weakened zone to transfer the transfer layer onto the handle substrate. Consequently, a compound material wafer is formed, and the transfer layer detached donor wafer provides a remainder substrate having a surface where the transfer layer was detached. Next, an additional layer is deposited onto a surface of the remainder substrate to increase its thickness and to form a reconditioned substrate, and the reconditioned substrate is recycled as a donor substrate for fabricating additional compound material wafers.

In an advantageous embodiment, the method further includes, prior to depositing the additional layer on the remainder substrate, detaching transfer layers from the donor substrate at least two times to form compound material wafers. In a variant, the method further includes, prior to depositing the additional layer on the remainder substrate, repeatedly using the donor substrate to form compound material wafers until a minimum thickness value is reached. The method may also beneficially include homoepitaxially depositing the additional layer onto the surface of the remainder substrate. The homoepitaxial layer may be deposited by at least one of a metal organic chemical vapor deposition method, a hybrid vapor phase epitaxy method, or a molecular beam epitaxy method. Advantageously, the homoepitaxial layer has a dislocation density of less than about $1\times10^7$ per $cm^2$.

The method may also advantageously include depositing the additional layer on the remainder substrate adjacent the surface that is positioned opposite to the surface wherein detachment occurred. In addition, a protective layer may be deposited on the detachment surface prior to depositing the additional layer on that surface. The protective layer may be made of an oxide material or a nitride material. Advantageously, the protective layer is removed prior to recycling the reconditioned substrate as the donor substrate. In a beneficial implementation, the surface of the remainder substrate is cleaned or polished before depositing the additional layer onto it.

In an advantageous aspect according to the invention, the donor substrate is made of at least one of gallium nitride, silicon carbide, germanium, aluminum nitride, or diamond. In addition, the handle substrate is made of a monocrystalline material or a polycrystalline material. In particular, the handle substrate may be made of at least one of silicon, gallium arsenide, zinc oxide, silicon carbide, or aluminum nitride. In a variant, the handle substrate is made of at least one of a glass or a ceramic material.

In another advantageous implementation, the method also includes, prior to bonding the donor substrate to the handle substrate, providing at least one of an insulating layer or a conducting layer on a bonding surface of the handle substrate. The insulating layer may be made of at least one of silicon dioxide or silicon nitride

BRIEF DESCRIPTION OF THE DRAWING FIGURES

Other aspects, purposes and advantages of the invention will become clear after reading the following detailed description with reference to the attached drawings, in which:

FIGS. 2a and 2b show donor substrates with two different kinds of deposited layers FIGS. 3a to 3c show the steps for fabricating compound material wafers according to a second embodiment of the invention.

DETAILED DESCRIPTION OF THE PREFERRED EMBODIMENTS

Figure 1:
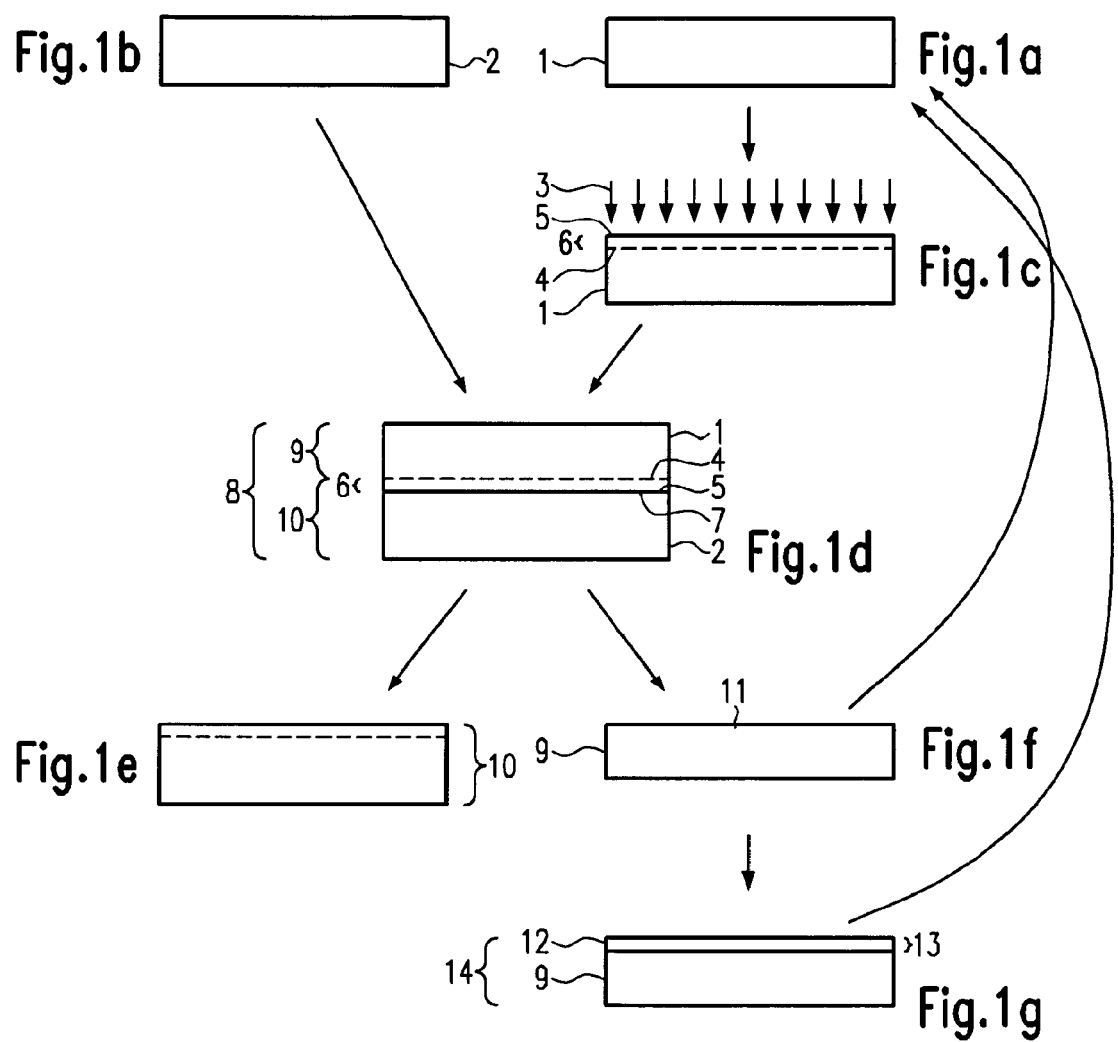
FIGS. 1a to 1g shows the steps for manufacturing compound material wafers according to an embodiment of the invention.

The embodiments shown in FIGS. 1a to 1g and FIGS. 2a to 2b are based on using the SMART-CUT® technology. However, it should be understood that other processes suitable for manufacturing a compound material wafer that include utilizing predetermined weakened areas could also be used.

FIG. 1a illustrates an initial donor substrate 1 that may be a wafer having a predetermined size. The donor substrate 1 may be made of a crystalline material like gallium nitride (GaN), silicon carbide (SiC), germanium (Ge), aluminum nitride (AlN) or diamond. These materials play an important role in micro-electronic and opto-electronic applications, but are difficult to manufacture and therefore relatively expensive. Consequently, the initial donor substrate 1 is used to transfer a thin layer of the donor material onto a handle substrate 2 (shown in FIG. 1b) of a cheaper material. Preferably, the coefficient of thermal expansion of the handle substrate 2 is similar to that of the initial donor substrate 1. In the case of GaN, for example, suitable handle substrate materials would be gallium arsenide (GaAs), zinc oxide (ZnO), silicon carbide (SiC) or aluminum nitride (AlN). For such handle wafers, the material does not necessarily have to be monocrystalline, and thus polycrystalline type wafers could also be used.

In a variant of the process, prior to a bonding step which is illustrated in FIG. 1d, an insulating layer such as a silicon dioxide ($SiO_2$) layer or a silicon nitride ($Si_3N_4$) layer, or a conducting layer, can be provided on the surface 7 of the handle substrate 2. Bonding of the handle substrate with the donor substrate 1 then would occur between such an insulating layer or such a conducting layer and the surface of the donor substrate.

In order to be able to transfer a layer of the donor substrate 1 onto the handle substrate 2, it is necessary to create a predetermined weakened zone in the initial donor substrate 1. FIG. 1c shows use of the SMART-CUT® technology wherein atomic species 3, such as hydrogen ions or other inert gases, are implanted through a main surface 5 with a predetermined dose and energy to create a predetermined weakened zone 4 in the donor substrate 1. The predetermined weakened zone 4 is substantially parallel to the main surface 5 of the donor substrate 1. A transfer layer 6 is thus created between the main surface 5 and the predetermined weakened zone 4, which will be transferred onto the handle substrate 2 during the following process steps.

FIG. 1d illustrates the next step in the process which consists of attaching the initial donor substrate 1 to the handle substrate 2 by bonding the main surface 5 of the donor substrate 1 to one of the main surfaces 7 of the handle substrate. The surface 5 and the surface 7 are preferably prepared prior to bonding to ensure adequate bonding. The donor handle structure 8 is then placed into a furnace (not shown) and heated so that the predetermined weakened zone 4 is further weakened leading to detachment of the remainder substrate 9 (shown in FIG. 1f) of the donor substrate 1 from the compound material wafer 10. FIG. 1e shows that the compound wafer 10 includes the handle substrate 2 and the transferred layer 6. Instead of providing thermal energy, additional energy in any form, for instance mechanical energy or a combination of thermal and mechanical energy, could be used during the weakening and detachment steps. Prior to using any further processing steps, the material compound wafer 10 may receive a final surface treatment, such as a polishing and/or a cleaning treatment.

The remainder substrate 9 shown in FIG. 1f may now be reused as an initial donor substrate 1, and the process may be repeated starting with the step illustrated in FIG. 1a, or a layer may be deposited which will be described further below with respect to FIG. 1f. Prior to reuse, the surface 11 of the remainder substrate 9 may be reconditioned by, for example, polishing before conducting the implanting and bonding steps shown in FIGS. 1c and 1d. The remainder substrate 9 can be reused several times, for instance up to 10 times. For example, the remainder substrate 9 could be used 10 times if each layer transfer and reconditioning step results in the removal of about 5 μm in material thickness, and if removal of about 50 μm from the bulk of a donor substrate 1 results in weakening the remainder substrate to the point that the quality of the transferred layers 6 suitable for the application would suffer. Thus, once the minimum thickness of the remainder substrate 9 is reached, or the minimum thickness necessary for the handling equipment to guarantee good results has been achieved, the method proceeds with the step illustrated in FIG. 1g. In particular, FIG. 1g illustrates depositing a layer 12 onto the remainder substrate 9 to increase the thickness and to form a reconditioned substrate 14. The thickness 13 of the deposited layer 12 allows the at least partially recovery of the thickness of the initial donor substrate 1, so that the reconditioned substrate 14 can be reused as the initial donor substrate 1 as illustrated in FIG. 1a.

FIG. 2a illustrates a variant wherein the deposited layer 12' is made out of a material which can be rapidly deposited onto the surface 15 of the remainder substrate 9 that is opposite to that of the surface 11 where detachment occurred. Thus, according to this variant, the emphasis is on rapidly restoring the thickness of the remainder substrate 9 to a thickness that is sufficient for further reuse. Consequently, it is not necessary that the material of the deposited layer 12' is the same as the material of the initial donor substrate 1. If, however, the material of layer 12' has been chosen to be the same as that of the remainder substrate 9, then the growth conditions can been chosen so that growth speed is optimized. In this case, the crystalline quality of the additional layer 12' may not be sufficient for later use as a transfer layer 6. Thus, once the initial donor substrate 1 has been completely consumed, a new donor substrate wafer 1 needs to be introduced into the process.

In FIG. 2b, the deposited layer 12" is made out of the same material as the remainder substrate 9. In addition, the deposited layer 12" is homoepitaxially grown so that the crystalline quality of the layer 12" is at least comparable to that of the remainder substrate 9. Layer 12" can be either deposited on surface 11 or on surface 15. In this case, no new donor substrate 1 needs to be introduced into the process because the deposited layer 12" can continue to serve as a transfer layer 6 later on. Using MOCVD, HVPE or MBE methods it is even possible to achieve deposited layers 12" having a crystalline quality that is better than that of the initial donor substrate 1. In particular, it is possible to achieve dislocation densities of less than $1 \times 10^7$ per $cm^2$, whereas the dislocation density of the initial donor substrate is typically larger than this value. FIG. 2a shows the case wherein the reconditioned donor substrate 14 will be attached to the handle substrate 2 via surface 11. In the case of FIG. 2b, both surfaces of the reconditioned donor substrate can be utilized.

FIG. 3 illustrates a second embodiment of the present manufacturing method in which the step illustrated in FIG. 1g is replaced by the process illustrated in FIGS. 3a to 3c. Corresponding elements and features shown in FIG. 1 have the same reference numerals, and are not explained again in detail; instead their description is incorporated by reference.

According to FIG. 3a, a protective layer 30 is deposited on the top surface 11 of the remainder substrate 9, wherein the top surface 11 is the surface at which detachment occurred. The protective layer 30 protects the top surface 11 against contamination or mechanical damage during further processing. Suitable protecting materials may include silicon dioxide or silicon nitride ($SiO_2$, $Si_3N_4$).

In FIG. 3b, the layer 12 is deposited on the bottom or opposite surface 15 of the remainder substrate 9. This is identical to that illustrated and described with respect to FIG. 1g of the first embodiment.

FIG. 3c illustrates the removal of the protective layer 30. The reconditioned donor substrate 14 includes the remainder substrate 9 and the deposited layer 12, and is then reused as an initial donor substrate 1. Eventually, removal of the protective layer 30 can be accompanied by an additional polishing and/or cleaning step of the top surface 11.

According to a further variant, after the growth of layer 12 the surface 16 of the additional layer could be provided with a further protective film to protect this surface of the reconditioned donor substrate 14 during the process steps illustrated in FIGS. 1a to 1f.

The application of the present manufacturing method is explained below in detail using the example of a compound wafer having a GaN transfer layer. Variants described herein will not be explained again in the following description but can also be used at any time and are therefore incorporated by reference.

An initial donor substrate 1 of a GaN wafer material is supplied, and a substrate consisting of a GaAS wafer having the same diameter is provided as the handle substrate 2. GaN wafers have a hexagonal structure, and have polar main surfaces, so that one surface presents Ga atoms (in the following Ga surface), and the other surface presents N atoms (in the following N surface). In order to transfer GaN layers, the free surface is usually the Ga surface, so that the N surface of the GaN wafer will bond with the handle substrate 2. Prior to starting the transfer process, the N surface of the GaN donor substrate 1 is polished to remove defective layers usually extending over 2 to 4 µm. The defective layers result from the buffer layer that has been used for the initial formation of the GaN wafer. However, certain other GaN substrates exist that do not have this inconvenience, such as those disclosed in published U.S. application 2004 175,902.

The predetermined weakened zone 4 may be created by implanting ions such as H ions (see the process step illustrated in FIG. 1c) with a dose in a range of about $1 \times 10^{15}$ at/$cm^2$ to about $1 \times 10^{18}$ at/$cm^2$ and with an energy in a range of about 20 keV to about 200 keV. With a dose of $5 \times 10^{16}$ at/$cm^2$ and an energy of about 60 keV the predetermined weakened zone is located at a depth of about a few hundred nanometers from the surface. Prior to implantation, a protective layer (made of, for example, $SiO_2$ or $Si_3N_4$) could be deposited to avoid contamination of the GaN layer and/or in order to form a layer that may assist in bonding to the handle substrate 2.

In accordance with FIG. 1d, the GaN substrate 1 and the handle substrate GaAs 2 are bonded together. To achieve adequate bonding, the main bonding surfaces 5, which represents a N surface, and the bonding surface 7 of the handle substrate must be flat as measured at the atomic scale. This is achieved by polishing the N surface of the GaN substrate, so that a roughness of below 0.3 nm RMS occurs as measured for a scan having a size of about 5 µm by about 5 µm. The donor handle compound structure 8 of FIG. 1d is then placed into a furnace and heat treated at a temperature situated within a range of about 200° C. to about 500° C. for about 1 to 6 hours to weaken the predetermined weakened zone 4 until detachment occurs. Alternatively, mechanical energy, such as by using a blade, or a mix of thermal and mechanical energy, can be employed to generate detachment.

After transfer layers have been detached from the initial GaN donor substrate 1 about 2 to 5 times, the remainder substrate 9 of the GaN material donor substrate is placed into an epitaxial reactor. A layer 12 of GaN is then epitaxially deposited on the Ga surface 15 using one of MOCVD, HVPE or MBE methods. The growth temperature may be within a range of about 700° C. to about 1100° C. Depending on the application, the deposited layer 12 can be doped. The total thickness of the deposited layer could be up to a few hundred µm, and is ideally selected to be equivalent to the thickness of the initial GaN donor substrate 1. Depending on the growth conditions, GaN layers are achieved that have better or worse dislocation density values than that found in the starting donor substrate.

It would be possible to provide and/or to remove adequate protective layers for the Ga or N surfaces depending on which surface is currently needed. In addition to reconditioning the Ga surface, an epi-ready step can be performed using an appropriate CMP and/or cleaning step. Once the GaN layer 12 deposited, a further SMART-CUT® process cycle can be performed wherein the above mentioned steps are repeated.

The inventive method thus includes providing an initial donor substrate, forming a predetermined weakened zone in the initial donor substrate, attaching the initial donor substrate to a handle substrate, and detaching the donor substrate at the predetermined weakened zone. A transfer layer of the initial donor substrate is therefore transferred onto the handle substrate to form a compound material wafer. A remainder substrate is also formed from the donor substrate, the remainder substrate being thinner than the initial donor substrate due to the transfer of the transfer layer. Next, an additional layer is deposited onto the remainder substrate after the detaching step to increase its thickness, and thus to at least approach the thickness of the initial donor substrate. Lastly, the remainder substrate with the deposited additional layer is reused as an initial donor substrate as the process is repeated.

The donor substrate employed in the present method is thinner than that employed in the prior art, as it is not bonded to an additional support substrate. Furthermore, due to the deposited layer, the thickness of the donor substrate does not vary much so that standard wafer-processing equipment can be employed. Moreover, the present method eliminates the need to employ time-consuming and expensive adapting or special handling equipment. Thus the present process is less expensive than that used in the prior art.

Before reusing the remainder of the donor substrate, an additional reconditioning step could be performed on the surface of the remainder of the donor substrate that is going to be attached to the handle substrate. For example, this reconditioning step could involve polishing.

In an advantageous implementation, the steps leading to transfer of the transfer layer to the handle substrate could be repeated at least two times before carrying out the depositing step. In this case, the detached remainder of the donor substrate is reused as the initial donor substrate. Repeating parts of the process prior to depositing a layer further helps to optimize the process, as less steps correspond to a faster and therefore less expensive production method. Preferably, the steps leading to transfer of the transfer layer to the handle substrate are repeated until the initial donor substrate reaches a predetermined minimal thickness. The upper limit for the number of repetitions can be determined by several considerations. First, the upper limit may be limited by the thickness of the remainder of the donor substrate for which certain properties, such as the mechanical strength, start to degrade. Alternately, the upper limit may be governed by the properties of the handling equipment which may require a certain minimum thickness of the substrate to function properly. The repetitions allow the overall process to be further optimized while at the same time ensuring high quality compound material wafers as well as a high production yield. According to a preferred embodiment, the layer deposited onto the remainder of the donor substrate can be the homoepitaxially deposited.

The present method is especially advantageous for use with expensive donor substrates, which are usually made of a crystalline material. By homoepitaxially regrowing the donor substrate to its initial thickness or greater, the process becomes independent of the availability of donor substrates because the number of times the donor substrate can be reused exceeds the amount of material necessary to consume the thickness of the initial donor substrate. In this context, homoepitaxial means that the deposited layer is made of the same material and has the same crystallographic properties as the material of the initial donor substrate.

Preferably, the deposited homoepitaxial layer can be provided by using a metal organic chemical vapor deposition (MOCVD) method, a hybrid vapor phase epitaxy (HVPE) method or a molecular beam epitaxy (MBE) method, to thereby achieve an improved dislocation density. In particular a dislocation density of less than about $1 \times 10^7$ per $cm^2$, and in particular less than $1 \times 10^6$ per $cm^2$ may be achieved in the homoepitaxial layer, as compared to the dislocation density in the initial donor substrate. Dislocations tend to block at a certain level during growth, so that additional grown material will be provided that has a lower dislocation density. Thus, the quality of the donor substrate material improves, so that the quality of the transferred layer will also improve as compared to transferred layers which are achieved by using standard donor substrates available on the market.

Advantageously, depositing an additional layer can comprise providing the layer on the surface of the remainder of the donor substrate which is opposite to the surface at which detachment occurred. When polar donor substrates are used, meaning that the two main surfaces of the substrate have different properties, it is usually true that epitaxial growth can be well controlled on one surface whereas that is not the case for the other surface. The free surface of the transferred layer of the material compound wafer should correspond to that which allows controlled growth of further epitaxial layers. The additional epitaxial layers may be needed in further process steps to create micro electronic or opto-electronic elements. As a consequence, the surface of the transferred layer that is attached to the surface of the handle substrate will be of the second type. Therefore, the surface of the remainder of the donor substrate at which detachment occurred has the polarity for which epitaxial growth is not so well controlled. Thus, the additional layer should preferably be deposited on the opposite side, where controlled homoepitaxial growth can occur, to ensure a high quality deposited layer.

In a preferable variant, before depositing the additional layer, the surface at which detachment occurred can be provided with a protective layer. The protective layer may be an oxide and/or a nitride layer. Such a protective layer advantageously protects the remainder substrate from contamination from metals or other particles, in particular when the additional layer is deposited on the opposite side of the remainder substrate. The protective layer improves or maintains the quality of the compound material wafer. Advantageously, the method can further include removing the protective layer prior to reusing the remainder substrate as an initial donor substrate. The removing step could also be accompanied by an additional polishing or cleaning step. Thus, when bonding the reconditioned substrate to a handle substrate, the surface properties of the reconditioned substrate are such that a high surface quality is achieved to ensure good bonding.

The surface on the side of the remainder substrate on which the additional layer is to be provided can be polished and/or cleaned prior to depositing the additional layer. This will improve the quality of the deposited additional layer, which is of particular interest when the additional layer is a homoepitaxial layer, as this layer will be used as a transfer layer during a later stage in the fabrication process.

The method is particularly advantageous when the donor substrate is composed of material of the group of gallium nitride (GaN), silicon carbide (SiC), germanium (Ge), aluminum nitride (AlN) or diamond. These substrates play an important role in electronic applications and it is difficult to obtain good quality substrates at reasonable prices. By using the above-described method with these types of materials it is possible to achieve good quality material compound wafers that are cheaper than the bulk material itself.

In an embodiment, the handle substrate is made of a monocrystalline or of a polycrystalline material, in particular one of the group of gallium arsenide (GaAs), zinc oxide (ZnO), silicon carbide (SiC) or aluminum nitride (AlN). It is preferable to use handle substrates that have a coefficient of thermal expansion that is similar to the donor substrate material, which further improves the quality of the material compound wafer. For further cost reduction, polycrystalline material can be advantageously employed as compared to monocrystalline material. In a more general case, the handle substrate could also be formed of silicon (Si) glass, or a ceramic material.

According to a variant, the handle substrate can be provided with an insulating layer. In particular the insulating layer may be made of silicon dioxide ($SiO_2$) or silicon nitride ($Si_3N_4$). Alternately, the handle substrate may be provided with a conducting layer on the surface which is going to be attached to the donor substrate. Such additional layers further increase the number of different compound material wafers suitable for various applications in microelectronics or optoelectronics. It should be understood that the present invention also relates to electronic, opto-electronic or optical components that include at least a part of the compound material wafer that is fabricated according to the above-described methods.

What is claimed is:

1. A method for fabricating compound material wafers, comprising:

providing a donor substrate having a surface;

forming a weakened zone in the donor substrate to define a transfer layer that includes the donor substrate surface;

bonding the surface of the transfer layer to a handle substrate;

detaching the donor substrate at the weakened zone to transfer the transfer layer onto the handle substrate thus forming a compound material wafer, with the transfer layer detached, the donor substrate providing a remainder substrate having a first surface where the transfer layer was detached;

epitaxially depositing an additional layer of a crystalline material onto a second surface of the remainder substrate to increase the thickness of the remainder substrate to that of the initial donor substrate to form a reconditioned substrate, wherein the second surface is positioned opposite to the first surface where detaching occurred;

providing an additional transfer layer on the first surface of the reconditioned substrate by forming a weakened zone therein after depositing the additional layer; and recycling the reconditioned substrate as a donor substrate for fabricating an additional compound material wafer that includes the additional transfer layer.

2. The method of claim 1, which further comprises, prior to depositing the additional layer on the remainder substrate, detaching transfer layers from the donor substrate at least two times to form compound material wafers.

3. The method of claim 1, which further comprises, prior to depositing the additional layer on the remainder substrate, repeatedly using the donor substrate to form compound material wafers until a minimum thickness value is reached.

4. The method of claim 1, which further comprises homoepitaxially depositing the additional layer onto the second surface of the remainder substrate.

5. The method of claim 4, wherein the homoepitaxial layer is deposited by at least one of a metal organic chemical vapor deposition method, a hybrid vapor phase epitaxy method, or a molecular beam epitaxy method.

6. The method of claim 5, wherein the homoepitaxial layer has a dislocation density of less than about $1 \times 10^2$ per $cm^2$.

7. The method of claim 1, which further comprises depositing a protective layer on the first surface prior to depositing the additional layer on the second surface.

8. The method of claim 7, wherein the protective layer is made of an oxide material or a nitride material.

9. The method of claim 7, which further comprises removing the protective layer prior to forming the weakened zone that provides the additional transfer layer when recycling the reconditioned substrate as the donor substrate.

10. The method of claim 1, which further comprises polishing or cleaning the surface of the remainder substrate before depositing the additional layer onto it.

11. The method of claim 1, wherein the donor substrate is made of at least one of gallium nitride, silicon carbide, germanium, aluminum nitride, or diamond.

12. The method of claim 1, wherein the handle substrate is made of a monocrystalline material or a polycrystalline material.

13. The method of claim 12, wherein the handle substrate is made of at least one of silicon, gallium arsenide, zinc oxide, silicon carbide, or aluminum nitride.

14. The method of claim 1, wherein the handle substrate is made of at least one of a glass or a ceramic material.

15. The method of claim 1, which further comprises, prior to bonding the donor substrate to the handle substrate, providing at least one of an insulating layer or a conducting layer on a bonding surface of the handle substrate.

16. The method of claim 15, wherein the insulating layer is made of at least one of silicon dioxide or silicon nitride.

17. The method of claim 1, wherein the additional layer that is deposited upon the remainder substrate is of a crystalline quality that is comparable to that of the remainder substrate.

18. The method of claim 1, wherein the additional layer that is deposited upon the remainder substrate is made of the same material as that of the remainder substrate.

19. The method of claim 18, wherein the additional layer that is deposited upon the remainder substrate is of a crystalline quality that is better than that of the remainder substrate.

* * * * *